United States Patent [19]
Galasco et al.

[11] Patent Number: 5,432,998
[45] Date of Patent: Jul. 18, 1995

[54] METHOD OF SOLDER BONDING PROCESSOR PACKAGE

[75] Inventors: Raymond T. Galasco, Vestal; Jaynal A. Molla, Endicott, both of N.Y.

[73] Assignee: International Business Machines, Corporation, Armonk, N.Y.

[21] Appl. No.: 97,744

[22] Filed: Jul. 27, 1993

[51] Int. Cl.⁶ ............................................. H05K 3/36
[52] U.S. Cl. ................................. 29/830; 228/180.21
[58] Field of Search .......................... 29/830, 840, 825; 228/180.21, 121, 122

[56] References Cited

U.S. PATENT DOCUMENTS

| | | | |
|---|---|---|---|
| 4,466,184 | 8/1984 | Cuneo | 29/830 |
| 4,685,210 | 8/1987 | King et al. | 29/830 |
| 5,146,674 | 9/1992 | Frankeny et al. | 29/830 |
| 5,280,414 | 1/1994 | Davis et al. | 29/830 X |
| 5,309,629 | 5/1994 | Traskos et al. | 29/830 |
| 5,316,205 | 5/1994 | Melton | 228/780.21 |

*Primary Examiner*—Carl J. Arbes
*Attorney, Agent, or Firm*—Richard M. Goldman

[57] ABSTRACT

Disclosed is a method of laminating circuitized polymeric dielectric panels with pad to pad electrical connection between the panels. This pad to pad electrical connection is provided by a transient liquid phase formed bond of a joining metallurgy characterized by a non-eutectic stoichiometry composition of a eutectic forming system. The eutectic temperature of the system is below the first thermal transition of the polymeric dielectric, and the melting temperature of the joining metallurgy composition is above the first thermal transition temperature of the polymeric dielectric.

1 Claim, 3 Drawing Sheets

METHOD OF SOLDER BONDING PROCESSOR PACKAGE

CROSS REFERENCE TO RELATED APPLICATIONS

This application is related to the following, commonly assigned United States Patent Applications:

U.S. patent application Ser. No. 08/097,544 filed Jul. 27, 1993, now U.S. Pat. No. 5,384,690 by Charles Davis, Thomas, Duffy, Steven Hankovic, Howard Heck, John Kolias, and John Kresge, David Light, and Ajit Trevidi for *Method of Fabricating a Flex Laminate Package* (Attorney Docket Number EN993034).

U.S. patent application Ser. No. 08/097,810 filed Jul. 27, 1993, now U.S. Pat. No. 5,374,344 by Thomas Gall and James Wilcox for *Method and Apparatus for Electrodeposition* (Attorney Docket Number EN993036).

U.S. patent application Ser. No. 08/098,085 filed Jul. 27, 1993, now U.S. Pat. No. 5,363,553 by Robert D. Edwards, Frank D. Egitto, Thomas P. Gall, Paul S. Gursky, David E. Houser, Jmes S. Kamperman, and Warren R. Wrenner for *Method of Drilling Vias and Through Holes* (Attorney Docket Number EN993037).

U.S. patent application Ser. No. 08/097,606 filed Jul. 27, 1993 by John H.C. Lee, Ganesh Subbaryan, and Paul G. Wildins for *Electromagnetic Bounce Back Braking for Punch Press and Punch Press Process* (Attorney Docket Number EN993038).

U.S. patent application Ser. No. 08/098,685 filed Jul. 27, 1993, now U.S. Pat. No. 5,347,710 by Thomas Gall, Howard Heck, and John Kresge for *Parallel Processor and Method of Fabrication* (Attorney Docket Number EN993039).

U.S. patent application Ser. No. 08/097,520 filed Jul. 27, 1993, now U.S. Pat. No. 5,379,193 by Thomas Gall and James Loomis for *Parallel Processor Structure and Package* (Attorney Docket Number EN993040).

U.S. patent application Ser. No. 08/097,605 filed Jul. 27, 1993 by Chi-Shi Chang and John P. Koons for *Parallel Processor Bus Structure and Package Incorporating The Bus Structure* (Attorney Docket Number EN993042).

U.S. patent application Ser. No. 08/097,603 filed Jul. 27, 1993 by Thomas Gall, James Loomis, David B. Stone, Cheryl L. Tytran, and James R. Wilcos for *Fabrication Tool and Method for Parallel Processor Structure and Package* (Attorney Docket Number EN993043).

U.S. patent application Ser. No. 08/097,601 filed Jul. 27, 1993 by John Andrejack, Natalie Feilchenfeld, David B. Stone, Paul Wilkin, and Michael Wozniak for *Flexible Strip Structure for a Parallel Processor and method of Fabricating The Flexible Strip* (Attorney Docket Number EN993044).

U.S. patent application Ser. No. 08/097,604 filed Jul. 27, 1993, now U.S. Pat. No. 5,346,117 by Donald Lazzarini and Harold Kohn for *Method of Fabricating A parallel processor Package* (Attorney Docket Number EN993045).

FIELD OF THE INVENTION

The invention relates to packaging structures for parallel processors, and more particularly to parallel processors having a plurality of printed circuit cards and/or boards, e.g., dedicated printed circuit cards and/or boards, for carrying processors, memory, and processor/memory elements. The printed circuit cards and/or boards are mounted on and interconnected through a plurality of circuitized flexible cable substrates, i.e., flex strips. The circuitized flexible cable substrates, i.e., flex strips, connect the separate printed circuit boards and cards through a central laminate portion. This central laminate portion provides Z-axis, layer to layer means for inter-processor, inter-memory, inter-processor/memory element, and processor to memory bussing interconnection, and communication through vias and through holes extending from flex strip to flex strip through the laminate. According to the invention there is provided a metallurgical bond between pads of adjacent layers in the package. The metallurgical connection is formed by transient liquid phase bonding in a process that is tolerant of manufacturing upsets.

BACKGROUND OF THE INVENTION

Parallel processors have a plurality of individual processors, all capable of cooperating on the same program. Parallel processors can be divided into Multiple Instruction Multiple Data (MIMD) and Single Instruction Multiple Data (SIMD) designs.

Multiple Instruction Multiple Data (MIMD) parallel processors have individual processing nodes characterized by fast microprocessors supported by many memory chips and a memory hierarchy. High performance inter node communications coprocessor chips provide the communications links to other microprocessors. Each processor node runs an operating system kernel, with communications at the application level being through a standardized library of message passing functions. In the MIMD parallel processor both shared and distributed memory models are supported.

Single Instruction Multiple Data (SIMD) parallel processors have a plurality of individual processor elements under the control of a single control unit and connected by an intercommunication unit. SIMD machines have an architecture that is specified by:

1. The number of processing elements in the machine.
2. The number of instructions that can be directly executed by the control unit. This includes both scalar instructions and program flow instructions.
3. The number of instructions broadcast by the control unit to all of the processor elements for parallel execution. This includes arithmetic, logic, data routing, masking, and local operations executed by each active processor element over data within the processor element.
4. The number of masking schemes, where each mask partitions the set of processor elements into enabled and disabled subsets.
5. The number of data routing functions, which specify the patterns to be set up in the interconnection network for inter-processor element communications.

SIMD processors have a large number of specialized support chips to support dozens to hundreds of fixed point data flows. Instructions come from outside the individual node, and distributed memory is supported.

Parallel processors require a complex and sophisticated intercommunication network for processor-processor and processor-memory communications. The topology of the interconnection network can be either static or dynamic. Static networks are formed of point-to-point direct connections which will not change during program execution. Dynamic networks are implemented with switched channels which can dynamically reconfigure to match the communications requirements of the programs running on the parallel processor.

Dynamic networks are particularly preferred for multi-purpose and general purpose applications, Dynamic networks can implement communications patterns based on a program demands. Dynamic networking is provided by one or more of bus systems, multistage intercommunications networks, and crossbar switch networks.

Critical to all parallel processors, and especially to dynamic networks is the packaging of the interconnection circuitry. Specifically, the interconnection must provide high speed switching, with low signal attenuation, low crosstalk, and low noise.

SUMMARY OF THE INVENTION

The invention relates to parallel processors, and more particularly to parallel processors having a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate portion. This central laminate portion provides means, e.g. Z-axis means, for inter-processor, inter-memory, inter-processor/memory element, and processor to memory bussing interconnection, and communication.

Parallel processor systems have a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data)..

The memory modules and the microprocessors communicate through various topologies, as hypercubes, and toroidal networks, solely by way of exemplification and not limitation, among others. These inter-element communication topologies have various physical realizations. According to the invention described herein, the individual logic and memory elements are on printed circuit boards and cards. These printed circuit boards and cards are, in turn, mounted on or otherwise connected to circuitized flexible substrates extending outwardly from a relatively rigid, circuitized laminate of the individual circuitized flexible substrates. The intercommunication is provided through a switch structure that is implemented in the laminate. This switch structure, which connects each microprocessor to each and every other microprocessor in the parallel processor, and to each memory module in the parallel processor, has the physical structure shown in FIG. 1 and the logical/electrical structure shown in FIG. 2.

More particularly, the preferred physical embodiment of this electrical and logical structure is a multilayer switch structure shown in FIG. 1. This switch structure provides separate layers of flex 21 for each unit or pairs of units, that is, each microprocessor, each memory module, or each microprocessor/memory element. The planar circuitization, as data lines, address lines, and control lines are on the individual printed circuit boards and cards 25, which are connected through the circuitized flex 21, and communicate with other layers of flex through Z-axis circuitization (vias and through holes) in the central laminate portion 21 in FIG. 1. The bus structure is illustrated in FIG. 2, which shows a single bus, e.g., a data bus as the A Bus, the B Bus, or the 0 Bus, connecting a plurality of memory units through a bus, represented by OR-gates, to four processors. The Address Bus, Address Decoding Logic, and Read/Write Logic are not shown. The portion of the parallel processor represented by the OR gates, the inputs to the OR gates, and the outputs from the OR gates is carried by the laminated flex structure 41.

Structurally the parallel processor 11 has a plurality of integrated circuit chips 29, as processor chips 29a mounted on a plurality of printed circuit boards and cards 25. For example, the parallel processor structure 11 of our invention includes a first processor integrated circuit printed circuit board 25 having a first processor integrated circuit chip 29a mounted thereon and a second processor integrated circuit printed circuit board 25 having a second processor integrated circuit chip 29a mounted thereon.

Analogous structures exist for the memory integrated circuit chips 29b, the parallel processor 11 having a plurality of memory chips 29b mounted on a plurality of printed circuit boards and cards 25. In a structure that is similar to that for the processor chips, the parallel processor 11 of our invention includes a first memory integrated circuit printed circuit board 25 having a first memory integrated circuit chip 29b mounted thereon, and a second memory integrated circuit printed circuit board 25 having a second memory integrated circuit chip 29b mounted thereon.

Mechanical and electrical interconnection is provided between the integrated circuit chips 29 mounted on different printed circuit boards or cards 25 by a plurality of circuitized flexible strips 21. These circuitized flexible strips 21 each have a signal interconnection circuitization portion 211, a terminal portion 213 adapted for carrying a printed circuit board or card 25, and a flexible, circuitized portion 212 between the signal interconnection circuitization portion 211 and the terminal portion 213. The signal interconnection circuitization portion 211, has X-Y planar circuitization 214 and vias and through holes 215 for Z-axis circuitization.

The flexible circuitized strips 21 are laminated at their signal interconnection circuitization portion 211. This interconnection portion is built up as lamination of the individual circuitized flexible strips 21, and has X-axis, Y-axis, and Z-axis signal interconnection between the processor integrated circuit chips 29a and the memory integrated circuit chips 29b. In the resulting structure the circuitized flexible strips 21 are laminated in physical through adhesive bonds and electrical connection through transient liquid phase bonded solder bonds at their signal interconnection circuitization portions 211 and spaced apart at their terminal portions 213.

According to our invention the individual circuitized flexible strips 21 are discrete subassemblies. These subassemblies are themselves a laminate of at least one internal power core 221, at least one signal core 222, with a layer of dielectric 223 therebetween. The dielectric 223 is a polymeric dielectric having a dielectric constant less than 3.5, as a polyimide or a perfluorocarbon polymer, or, in a preferred exemplification, a multiphase composite of a polymeric dielectric material having a low dielectric constant and having a low dielectric constant, low coefficient of thermal expansion material dispersed therethrough. Preferably the composite has a dielectric constant less than 3.5, and preferably below about 3.0, and in a particularly preferred embodiment below about 2.0. This is achieved by the use of a low dielectric constant perfluorocarbon polymer matrix, filled with a low dielectric constant and low coefficient of thermal expansion filler. The perfluorocarbon polymer is chosen from the group consisting of perfluoroethylene, perfluoroalkoxies, and copolymers thereof. The dispersed low dielectric constant material is a low dielectric constant, low coefficient of thermal expansion, particulate filler. Exemplary low dielectric constant particulate filler are chosen from the group consisting of silica particles, silica spheres, hollow silica spheres, aluminum oxide, aluminum nitride, zirconium oxide, titanium oxide, and the like.

The power core 221 may be a copper foil, a molybdenum foil, or a "CIC" (Copper-Invar-Copper) laminate foil. The circuitized flexible strip 21 may be a 1S1P (one signal plane, one power plane) circuitized flexible strip, a 2S1P (two signal planes, one power plane) circuitized flexible strip or a 2S3P (two signal planes, three power planes) circuitized flexible strip.

The circuitized flexible strip 21 can have either two terminal portions 213 for carrying printed circuit boards 25 at opposite ends thereof, or a single terminal portion 213 for carrying a printed circuit board 25 at only one end of the circuitized flexible cable 21. Where the circuitized flexible strip 21 is adapted to carry a printed circuit board 25 at only one end, a pair of circuitized flexible strips 21, each having a terminal portion 213 at only one end can be laminated so that their signal interconnection circuitization portions 211 overlap but their terminal portions 213 and their flexible, circuitized 212 portions extend outwardly from opposite sides of the signal interconnection circuitization laminated body portion 41 of the parallel processor package 11.

According to our invention the solder alloy means for pad to pad joining of the circuitized flexible strips 21 at the signal interconnection circuitization portions 211 thereof is an alloy composition having a final melting temperature, when homogenized, above the primary thermal transition temperature of the dielectric material and having a system eutectic temperature below the primary thermal transition temperature of the dielectric. This can be a series of Au and Sn layers having a composition that is gold rich with respect to the system eutectic, said alloy having a system eutectic temperature of about 280 degrees Centigrade, and a homogeneous alloy melting temperature above about 400 degrees Centigrade, and preferably above about 500 degrees Centigrade. The Sn is protected from the environment by an Au thin film as described herein.

According to our invention it is possible to join a first circuitized polymeric panel 21 to a second circuitized polymeric panel 21, where each of the circuitized polymeric panels 21 has at least a pair of facing, electrically conductive pads 216 for panel to panel electrical connection. In this method of the invention metals are deposited 217 onto the facing pads 216 for metallurgical bonding. The metals selected, for example Au and Sn, are those that are capable of forming a eutectic. The metals are deposited in a non-eutectic stoichiometry. The assembly is than heated while a compressive force is applied to the circuitized polymeric panels 21 to bond the panels 21. The panels 21 are heated above the first thermal transition temperature (e.g., the glass transition temperature or the melting temperature) of the polymeric dielectric or of the adhesive, if any. The eutectic temperature of the eutectic forming system is below the first thermal transition temperature (e.g., the glass transition temperature or the melting temperature) of the dielectric polymer used in bonding. However, the actual stoichiometry of the deposit is non-eutectic, and the melting temperature of the homogenized metallic composition is above the melting point of the dielectric polymer used in bonding. In a preferred embodiment of this exemplification of the invention the eutectic forming system is Au-Sn, the first thermal transition temperature (e.g., the glass transition temperature or the melting temperature) of the dielectric polymer is above the eutectic temperature of the Au-Sn system, and below the melting temperature of the homogenized Au-Sn alloy formed. According to our invention a thin film or flash plate of Au is applied above the Sn to keep the Sn from oxidizing during processing or storage.

According to a further embodiment of the invention there is provided a laminate 41 of circuitized polymeric dielectric panels 21 with pad 216 to pad 216 electrical connection between the circuitized flexible panels 21. This pad 216 to pad 216 electrical connection is provided by a transient liquid phase formed bond of a joining metallurgy characterized by a non-eutectic stoichiometry composition of a eutectic forming system. The eutectic temperature of the system is below the first thermal transition temperature (e.g., the glass transition temperature or the melting temperature) of the polymeric dielectric, and the final melting temperature of the homogenized joining metallurgy composition is above the first thermal transition temperature of the polymeric dielectric. In a preferred embodiment of this exemplification the joining metallurgy is an Au rich Au-Sn alloy. Preferably the Au-Sn alloy has an atomic ratio of Au/[Au+Sn] of at least about 0.6, and preferably about 0.8 to 0.9.

THE FIGURES

The invention may be understood by reference to the Figures appended hereto.

DETAILED DESCRIPTION OF THE INVENTION

Figure 1:
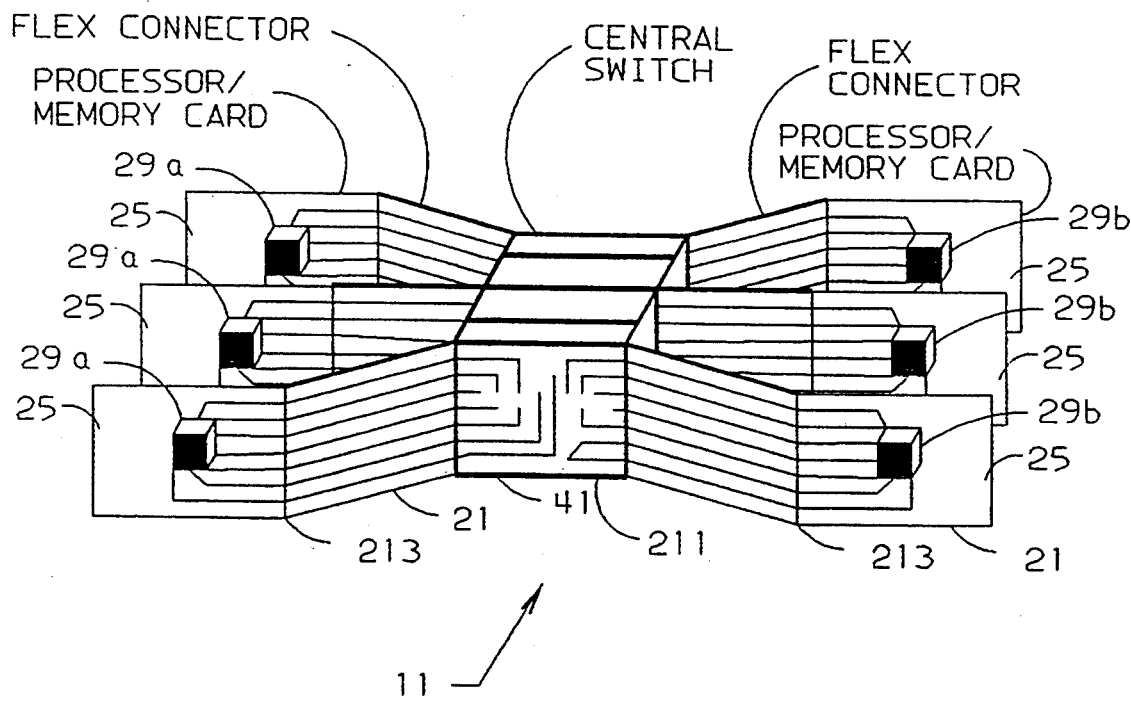
FIG. 1 shows an overview of the mechanical and structural features of the parallel processor package of the invention.

The invention described herein relates to a parallel processor 1 and a parallel processor package 11 having a plurality of integrated circuit chips 29, e.g., microprocessors 29a, preferably advanced microprocessors, and memory modules 29b, mounted on printed circuit cards and boards 25, and connected through a laminate 41 of circuitized flexible strips 21 as will be described herein below. The structure and methods of fabricating the structure and similar structures are useful in parallel processors, in bank switched memory with memory banks or fractional memory banks on an individual flex connector, and for providing flex cable to flex cable connection in a heavily interconnected network.

Advanced microprocessors, such as pipelined microprocessors and RISC (reduced instruction set computer) microprocessors provide dramatic increases in chip level integration and chip level circuit densities. These advanced microprocessors, in turn, place increasing demands on wiring densities and interconnections at the next lower levels of packaging. Moreover, when advanced microprocessors are combined into multi-processor configurations, i.e., parallel processors, as SIMD and MIMD parallel processors, still higher levels of performance, circuit density, including logic density and memory density, and I/O packaging, are all required.

The basic parallel processor structure 11 of the invention, e.g., an SIMD or an MIMD parallel processor, builds from a plurality of microprocessors 29a and a plurality of memory modules 29b, with the memory modules 29b and the microprocessors 29a communicating through a laminate switch structure 11. This switch, which connects each microprocessor 29a to each and every other microprocessor 29a in the parallel processor 1, and to each memory module 29b in the parallel processor 1, has the logical/electrical structure shown in FIG. 2.

Figure 3:
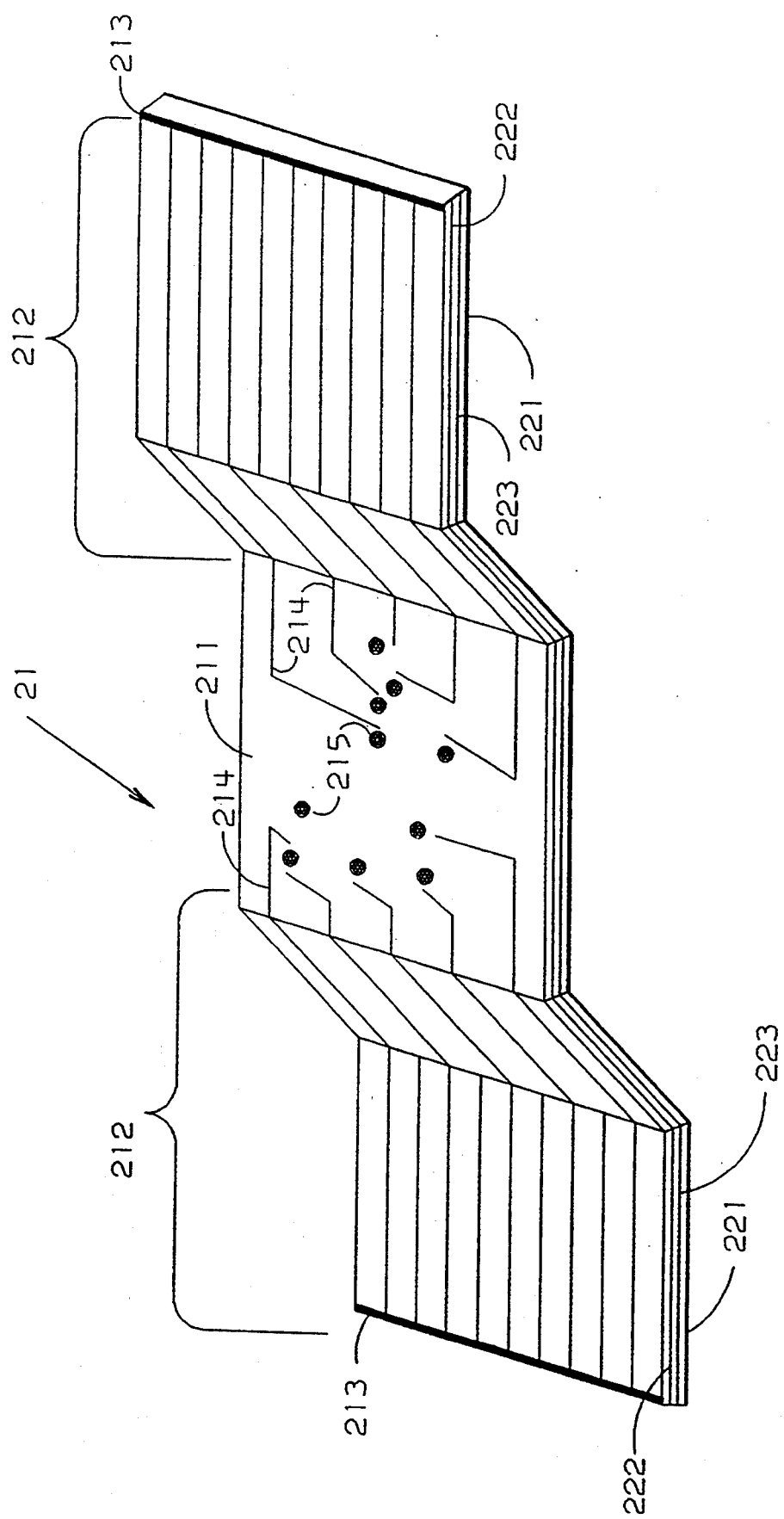
FIG. 3 shows a perspective view of a circuitized flexible strip of the invention having surface circuitization, Pd dendrites for connecting the printed circuit boards or cards thereto, and joining metallurgy, vias, and through holes on the portion intended to be laminated.

Laminate Switch Structure,

The parallel processor package 11 of the invention integrates carrier, connector, and I/O into a single package, with multiple circuitized flexible cables 21 that are built into a carrier cross section 41 using discrete subassemblies 21 which are laminated together to form a Z-axis signal and power connection laminate 41 between the discrete subassemblies 21. A discrete subassembly is shown generally in FIG. 3.

The physical embodiment of the package 11 yields high performance by utilizing high wirability printed circuit board technology that enhances present printed circuit card and board technology for massively parallel processor systems, while providing cost and performances advantages. Both the laminate 41, which we refer to as a central, switch, or rigid portion, and the outwardly extending flex portions 21 (intended for attachment to printed circuit boards or cards 25 carrying the memory modules 29b and the logic modules 29a) are characterized by printed circuit board like cross sections, and a low dielectric constant polymer substrate.

The physical embodiment of this electrical and logical structure encompasses the multilayer laminate switch structure shown in FIG. 1. This switch structure provides a separate layer of flex 21 for each printed circuit board or card 25 or each pair thereof. Each individual printed circuit board or card 25 can carry a microprocessor 29a, a memory module 29b, I/O, or a microprocessor/memory element. The planar circuitization 214, as data lines, address lines, and control lines is on the flex 21, and communicates with other layers of flex 21 through vias and through holes 217 in the laminate central portion 41, shown in FIG. 3.

This laminate flex design provides a large number of I/O's, for example twenty five thousand or more, from the package 11 while eliminating the need for the manufacture, alignment, and bonding of discrete flex cables extending outwardly from a single panel. A conventional planar panel would have to be many times larger to have room for the same connectivity as the integrated flex/rigid/flex or rigid/flex of the invention.

Flex Card Carriers Joined At A Central Laminate Switch Portion

The package 1 of the invention combines a laminate central or switch portion 41 and circuitized flexible strip extensions 21 extending outwardly therefrom and carrying terminal printed circuit boards and cards 25 for circuit elements 29a and 29b, as integrated circuit chips 29, thereon.

Heretofore flex cables and flex carriers have been integrated onto one or two surfaces, i.e., the top surface or the top and bottom surfaces, of a carrier. However, according to the present invention the flex cables 21 are integrated into a central switch or carrier structure 41 as a laminate with a plurality of stacked, circuitized flex strips 21. The area selective lamination of the flex carriers 21 in the central region 211 forms the rigid laminate carrier 41. This laminate region 41 carries the Z-axis circuitization lines from flex 21 to flex 21.

The individual plies of flex 21 have internal conductors, i.e., internal power planes 221 and internal signal planes 222. Additionally, in order to accommodate the narrow dimensional tolerances associated with the high I/O density, high wiring density, and high circuit density, it is necessary to carefully control the Coefficient of Thermal Expansion (CTE) of the individual subassemblies. This is accomplished through the use of an internal metallic conductor 221 of matched coefficient of thermal expansion (CTE), such a molybdenum foil or a Cu/Invar/Cu foil, to which the layers of dielectric 223 are laminated.

The combination of circuitized flex 21 extending outwardly from a central laminate section 41, with vias 215 and through holes 215 electrically connecting separate plies 21 of circuitized flex therethrough, reduces the footprint associated with the chip carrier, as wiring escape is easier.

This structure offers many advantages for a parallel processor, especially a massively parallel processor, as well as any other heavily interconnected system. Among other advantages, a reduced size chip carrier is possible, as escape is made easier, signal transmission lengths are reduced, and discontinuities due to contact mating between chip carrier and flex are reduced and reliability is enhanced as the chip carrier and the flex are a single entity.

The design of the parallel processor package calls for all vertical (Z-axis) connections to be made by bonding a joining alloy, e.g., transient liquid phase bonding Au/Sn, and the organic dielectric, as a perfluoropolymer, into a laminate of circuit panels, while the outwardly extending edges 212 and 213 of the panels 21 are not bonded, so that they can act as circuitized flex cables. This flexibility or bendability allows the printed circuit boards and cards 25 to be offset from one another remote from the laminate 41.

Specialized Cards and Boards

The parallel processor package of our invention allows a variety of component types to be mounted on the flexible elements. Specifically, the printed circuit card and board terminated circuitized flex strips are analogous to printed circuit boards and cards mounted in expansion slots in a conventional planar motherboard. The cards and boards at the ends of the circuitized flex strips can include Tape Automated Bonding (TAB) components, e.g., high I/O, fine lead pitch TAB.

Alternatively, surface mount circuitization can be utilized, for example, fine pitch plastic and ceramic surface mount packages.

Alternatively, high I/O area array solder ball connection techniques may be used. One such high I/O area array solder ball connected chip is shown mounted on a card that is, in turn, mounted on a flexible cable.

According to still further embodiment of the invention chip on board bonding and interconnection may be used.

Detailed Structural Design and Fabrication

According to a preferred embodiment of our invention, the central switch portion, i.e., the laminate portion, and the flex strips, used as card carriers in a manner analogous to expansion slots, are a single structural entity. This is achieved by selectively defining and controlling the adhesion between the layers of the structure. The layers can be either (1) discrete 2S3P (2 signal plane, 3 power plane) structures, or (2) combinations of discrete 2S3P (2 Signal plane, 3 power plane) and 2S1P (2 signal plane, 1 power plane) structures.

Figure 2:
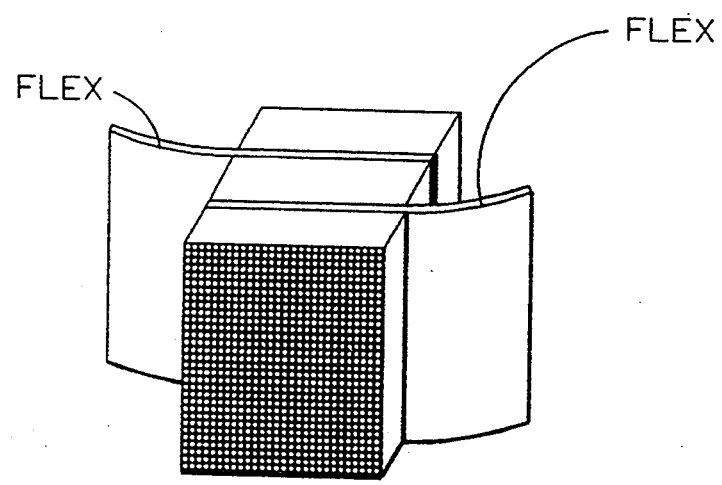
FIG. 2 shows the lamination of circuitized flexible strips to form a laminate with free portions.

The areas of the panel treated to achieve adhesion are laminated together to form the laminate 41, as shown in FIG. 2. Regions where there is no adhesion remain as flexible strips 21. Cards, either removable or soldered, for carrying microprocessor chips and/or memory chips, are carried by these outward extending segments of flex.

According to one method of the invention, a low coefficient of thermal expansion (CTE) tri-metallic foil as Copper/Invar/Copper (CIC) 221 is laminated between perfluorocarbon polymer sheets 222. The resulting laminate is than circuitized 223 to form a circuitized flex strip 21. More specifically, a solid, 1 mil, Cr sputtered, Cu/Invar/Cu panel, 14.5×10.0 inches, is sandwiched between 2 sheets of Rogers 2800 PFA dielectric sheet material or similar dielectric sheet material. Lamination is carried out at a high temperature, e.g., about 390 degrees C., and a high pressure, e.g., 1700 psi, for 30 minutes, in a non-reactive atmosphere, e.g., $N_2$. Metal layers, foils, and films may be laminated to the substrate to manage electromagnetic fields and provide electromagnetic shielding between layers. Additional dielectric sheets may be laminated to one or both sides of the structure, for example, after circuitization.

Subsequently, the subassemblies are laminated together, generally at a lower pressure, but otherwise substantially under the conditions described above. This is because core lamination, carried out at relatively high pressures, for example, above about 300 psi, densifies the dielectric, while laminations carried out at below about 300 psi do not densify the dielectric. The multilayer lamination is defined so that controlled and selective adhesion is achieved. This can be accomplished preferably by selection of adhesives, and alternatively by masking. That is, those portions that are not to be laminated together, i.e., that are to remain as outwardly extending flex, are either masked or coated with a high melting temperature perfluoroalkoxy to selectively control adhesion.

Fabrication of Vias, Through Holes, and Plated Through Holes

The Z-axis intensive design of the laminate or "switch" portion of the parallel processor package of the invention requires special attention and care in the fabrication of the package. This is especially true for the vias and through holes.

Two joining metallurgies can be used to provide the structure of the invention. One such structure is dendritic Pd used for high electrical conductive, separable connections. Dendritic Pd can be used to join the printed circuit boards and cards to the circuitized flex strips. Solder or transient liquid phase bonding metallurgy, e.g., Au/Sn, is used to metallurgically bond the conductor pads and lands of the laminate portion.

In the case of transient liquid phase bonding, the Au/Sn metallurgy is present at plated through holes (typically of 4 mil diameter), and at blind vias (typically of 6 mil diameter).

The central laminate 13 of flex provides the interconnect switching between the flex strips 21, and is plated with Au/Sn for transient liquid phase bonding.

According to the method of the invention, Au/Sn is selectively electroplated onto the portions 211 of the flex 21 intended to be bonded to the pads and lands, e.g., Cu pads and lands 216 in the laminated, rigid central portion 41 of the parallel processor package 11. The Sn is thereafter flash plated with a thin oxygen barrier film of Au.

In the fabrication of the laminate, lamination is a parallel process. That is, the individual polymeric dielectric panels, e.g., flex panels 21, can be, and preferably are, laminated together simultaneously with and in the same process steps as the electrical interconnection.

The individual polymeric dielectric panels 21 are laminated in an adhesive process in which plies of the polymeric dielectric 21 are heated under compression to effect surface joining. The process may be carried with an adhesive hetero-layer between the panels 21, as a layer of a polyimide adhesive, or by thermal and compressive flow of the polymeric dielectric substrate material, or by a combination of both. Adhesive bonding is carried out by a temperature and pressure sequence in which the adhesive, or the polymeric dielectric, is heated above its glass transition temperature, and optionally above its melting temperature, under pressure, to form a bond between the plies 21.

Electrical interconnection is accomplished by metallurgically bonding pairs of pads on facing surfaces of the subassemblies. While pad to pad metallurgical solder bonding is feasible with a small number of layers and with low circuit density, bridging between adjacent solder bonded pad pairs becomes a serious limitation at high circuit densities and when there are a large number of layers to be laminated. Each subsequent lamination causes previously formed solder bonds to melt and reflow, causing shorting between adjacent lands.

According to the present invention, transient liquid phase bonding is utilized for electrical interconnection of the subassemblies. Transient liquid phase bonding is described in, for example, commonly assigned U.S. Pat. No. 5,038,996 of James R. Wilcox and Charles G. Woychik for BONDING OF METALLIC SURFACES, and commonly assigned U.S. patent application Ser. No. 07/536,145, filed Jun. 11, 1990, now U.S. Pat. No. 5,280,414, granted Jan. 18, 1994, of Charles R. Davis, Richard Hsiao, James R. Loomis, Jae M. Park, and Jonathan D. Reid for AU-SN TRANSIENT LIQUID BONDING IN HIGH PERFORMANCE LAMINATES, the disclosures of both of which are hereby incorporated herein by reference.

Transient liquid phase bonding is a diffusion bonding technique which involves depositing non-eutectic stoichiometries of metals which are capable of forming a eutectic on facing pads. The pads, which are formed of an electrically conductive metal, as Cu, Ag, or Au, are coated with the stoichiometrically non-eutectic composition of eutectic forming metals, brought into physical contact with one another, and heated above the eutectic temperature. This initially forms a melt of eutectic + solid. However, this melt quickly solidifies because higher melting metals and intermetallics from the high melting phase diffuse into the melt. Solidification of this liquid forms a metallurgical bond between the facing pads. Transient liquid phase bonding is accomplished with a small amount of bonding material per joint, and without flux.

According to our invention the eutectic temperature associated with the system is below the melting temperature of the adhesive and/or the dielectric polymer used in bonding, while the melting point of the resulting actual metallic composition formed is above the melting point of the adhesive and/or the dielectric polymer used in bonding.

According to a preferred method of our invention a gold-tin alloy on the gold-rich side of the gold-tin eutectic is used as the bonding alloy. In a preferred exemplification of the invention the Au-Sn alloy has an atomic ratio of Au/[Au+Sn] of at least about 0.6, and preferably about 0.8 to 0.9, corresponding to the intermetallic solid $AuSn + AuSn_2$.

At the low heating rates characteristic of the lamination process, the gold-tin alloy initially forms a eutectic melt at a low temperature, e.g., the Au-Sn eutectic of 280 degrees C. However, as additional gold diffuses into the melt, the melting point increases. Ultimately, with increasing time at the polymer adhesion temperature during lamination of subsequent layers, further diffusion of gold into the melt occurs and a non-eutectic gold-tin alloy is formed having a higher melting point than any temperatures attained in subsequent processing. This avoids bridging as well as avoiding the formation of brittle intermetallics.

The melting temperature of the adhesive and/or the melting temperature of the dielectric polymer is above the eutectic temperature of the Au-Sn system, but below the melting temperature of the Au-Sn alloy formed. As a result the metallurgical bond will not melt or flow during subsequent processing.

It should be noted that the Au-Sn phase diagram is an equilibrium phase diagram, and that phase transfer kinetics may actually determine the phases and phase compositions formed in transient liquid phase bonding.

In transient liquid phase bonding, Au is plated onto both Cu lands, followed by a plate of Sn atop one of the Au plates. In one embodiment the Au is electroplated from a cyanide gold salt bath containing about 8 to 32 grams/liter gold (basis: metallic gold) at an acid pH (e.g., approximately pH=5.5). Sn is then electroplated atop one of the two gold layers, e.g., from a methane sulfonic acid solution containing approximately 8 to 12 grams per liter stannous sulfate. Parallel lamination and interconnection is than typically carried out at a temperature of about 280 degrees Centigrade to about 390 degrees Centigrade, and preferably about 275 to 300 degrees Centigrade, and at a pressure of about 200 psi to about 500 psi.

While transient liquid phase bonding has been described with respect to Au-Sn alloys, it is, of course, to be understood that other metallurgies can be utilized, as Sn-Bi.

In the Au-Sn system the Sn is subject to attack by both the air and the liquids (including the electrodeposition solution). This severely limits the shelf life of the Sn, necessitating lamination relatively quickly after plating in order to obtain a relatively satisfactory metal to metal bond.

According to our invention, there is provided a electroplate or film of a relative inert oxygen barrier metal, especially Au, atop the Sn. This protects the underlying Sn metallurgy from oxidation during storage and handling. Thus in an Au-Sn system, a thin Au film is present atop the Sn. This protects the Sn layer from surface oxidation during processing. The Au layer may be formed by overplating the Sn with a thin, protective layer of Au.

Accordingly, it is necessary to protect the Sn from oxidation by a thin layer of Au. This layer, on the order of about 30 to 60 microinches of high purity Au, e.g., in excess of 99.97 weight percent Au, prevents oxygen permeation into the Sn. The Au coating is a conformal coating, for example an electroplate.

In order to obtain the required conformality it is necessary to have live entry of the Sn material, i.e., hot plugging. That is, a potential is applied to the Sn part prior to contacting with or immersing in the Au electroplating solution. This is referred to as hot plugging. Hot plugging eliminates Sn dissolution in the Au electroplating solution, and eliminates the porous plating of Au onto a non-adherent Sn oxide base.

The Sn piece is at a potential of at least about 0.73 volt versus a silver/silver chloride electrode, with the electroplating solution at a temperature of at least about 140 degrees F. (60 degrees Celsius), and a current density of at least about 3 amperes per square foot.

According to the invention a thin layer of Au is electroplated above the Sn. This protects the Sn from attack, and is readily dissolved during the transient liquid phase bonding process.

By the method of our invention there is provided a lamination of circuitized polymeric dielectric panels with pad to pad electrical connection therebetween. The pad to pad electrical connection is provided by a transient liquid phase formed bond of a joining metallurgy characterized by a non-eutectic stoichiometry composition of a eutectic forming system, the eutectic temperature being below the melting temperature of the polymeric dielectric, and the melting temperature of the joining metallurgy composition being above melting temperature of the polymeric dielectric. In a preferred exemplification the melting temperature of the joining metallurgy composition is above the melting temperature of the polymeric dielectric.

In an alternative exemplification, where an adhesive heterolayer is present between the individual polymeric dielectric plies, the eutectic temperature is below the melting temperature or thermosetting temperature of the adhesive, and the melting temperature of the joining metallurgy composition is above melting temperature of the adhesive. In a preferred exemplification the melting temperature of the joining metallurgy composition is above the melting temperature of the adhesive.

While the invention has been described with respect to certain preferred embodiments and exemplifications, it is not intended to limit the scope of the invention, but solely by the claims appended hereto.

We claim:

1. A method of joining a first circuitized polymeric panel to a second circuitized polymeric panel, each of said circuitized polymeric panels having at least a pair of facing, electrically conductive pads for panel to panel electrical connection, said method comprising a. electrodepositing Au and Sn on said pair of facing pads, comprising (i) first electrodepositing Au on both of said pads, (ii) thereafter electrodepositing the Sn atop the Au on one of said pads and (iii) thereafter depositing a thin, second layer of Au about 30 to 60 microinches thick atop the Sn whereby there is no Sn exposed to the environment, said Au and Sn metals being a eutectic forming system and having a stoichiometry that is a non-eutectic stoichiometry of at least about 86 weight percent Au when homogenized;

b. providing an adhesive on at least one of the circuitized polymeric panels; and c. heating and applying a compressive force to the circuitized polymeric panels to bond the panels; wherein said panels are heated above the first thermal transition temperature of the adhesive, the eutectic temperature of the eutectic forming system is below the first thermal transition temperature of the adhesive used in bonding, and the homogenized alloy melting temperature of the Au-Sn metallic composition is above the first thermal transition temperature of the adhesive used in bonding.

* * * * *